(12) United States Patent
Niwa

(10) Patent No.: US 11,804,464 B2
(45) Date of Patent: Oct. 31, 2023

(54) SEMICONDUCTOR DEVICE AND MANUFACTURING METHOD THEREOF

(71) Applicant: Kioxia Corporation, Tokyo (JP)

(72) Inventor: Keiichi Niwa, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 94 days.

(21) Appl. No.: 17/190,918

(22) Filed: Mar. 3, 2021

(65) Prior Publication Data

US 2022/0005779 A1 Jan. 6, 2022

(30) Foreign Application Priority Data

Jul. 6, 2020 (JP) .................................. 2020-116296

(51) Int. Cl.
*H01L 23/00* (2006.01)
*H01L 25/18* (2023.01)
*H01L 21/56* (2006.01)
*H01L 23/31* (2006.01)
(Continued)

(52) U.S. Cl.
CPC ............ *H01L 24/30* (2013.01); *H01L 21/563* (2013.01); *H01L 23/293* (2013.01); *H01L 23/3135* (2013.01); *H01L 23/5383* (2013.01); *H01L 24/13* (2013.01); *H01L 24/27* (2013.01); *H01L 25/18* (2013.01); *H01L 2224/1357* (2013.01); *H01L 2224/1369* (2013.01); *H01L 2224/13551* (2013.01); *H01L 2224/27515* (2013.01); *H01L 2224/3003* (2013.01); *H01L 2224/30104* (2013.01); *H01L 2224/30515* (2013.01);
(Continued)

(58) Field of Classification Search
None
See application file for complete search history.

(56) References Cited

U.S. PATENT DOCUMENTS 7,911,045 B2 * 3/2011 Matsushima ........... H01L 24/82
257/777
7,956,449 B2 * 6/2011 Lee ...................... H01L 21/6835
438/109
(Continued)

FOREIGN PATENT DOCUMENTS

| JP | 2018-152417 A | 9/2018 |
|---|---|---|
| TW | 201921625 A | 6/2019 |
| TW | 201926601 A | 7/2019 |

*Primary Examiner* — Nishath Yasmeen
(74) *Attorney, Agent, or Firm* — Foley & Lardner LLP

(57) ABSTRACT

A semiconductor device includes a wiring board; a first semiconductor chip including a first surface, a second surface, and a connection bump on the first surface, the first semiconductor chip coupled to the wiring board through the connection bump; a resin layer covering the connection bump between the first semiconductor chip and the wiring board, an upper surface of the resin layer parallel to the second surface of the first semiconductor chip; and a second semiconductor chip including a third surface, a fourth surface, and an adhesive layer on the third surface, the second semiconductor chip adhering to the second surface of the first semiconductor chip and the upper surface of the resin layer through the adhesive layer. The upper surface of the resin layer projects outside a portion of at least an outer edge of the second semiconductor chip when viewed from the top.

9 Claims, 14 Drawing Sheets

(51) Int. Cl.
  *H01L 23/29*   (2006.01)
  *H01L 23/538*   (2006.01)

(52) U.S. Cl.
  CPC ............. *H01L 2924/1431* (2013.01); *H01L 2924/1438* (2013.01)

(56) References Cited

U.S. PATENT DOCUMENTS

| | | | |
|---|---|---|---|
| 8,791,558 B2* | 7/2014 | Bae | H01L 24/49 |
| | | | 257/784 |
| 10,297,571 B2* | 5/2019 | Ozawa | H01L 23/3135 |
| 10,854,576 B2 | 12/2020 | Karakane et al. | |
| 2007/0075435 A1* | 4/2007 | Suminoe | H01L 23/49816 |
| | | | 257/E23.021 |
| 2008/0029869 A1* | 2/2008 | Kwon | H01L 25/03 |
| | | | 257/E23.18 |
| 2012/0018885 A1* | 1/2012 | Lee | H01L 23/481 |
| | | | 257/738 |
| 2013/0049221 A1* | 2/2013 | Han | H01L 21/561 |
| | | | 257/E23.116 |
| 2013/0137217 A1* | 5/2013 | Kindo | H01L 21/50 |
| | | | 438/109 |
| 2013/0299957 A1* | 11/2013 | Kobayashi | H01L 23/49575 |
| | | | 257/676 |
| 2015/0069632 A1* | 3/2015 | Ozawa | H01L 23/49838 |
| | | | 257/777 |
| 2019/0067248 A1 | 2/2019 | Yoo et al. | |
| 2019/0164888 A1 | 5/2019 | Chang Chien et al. | |

\* cited by examiner

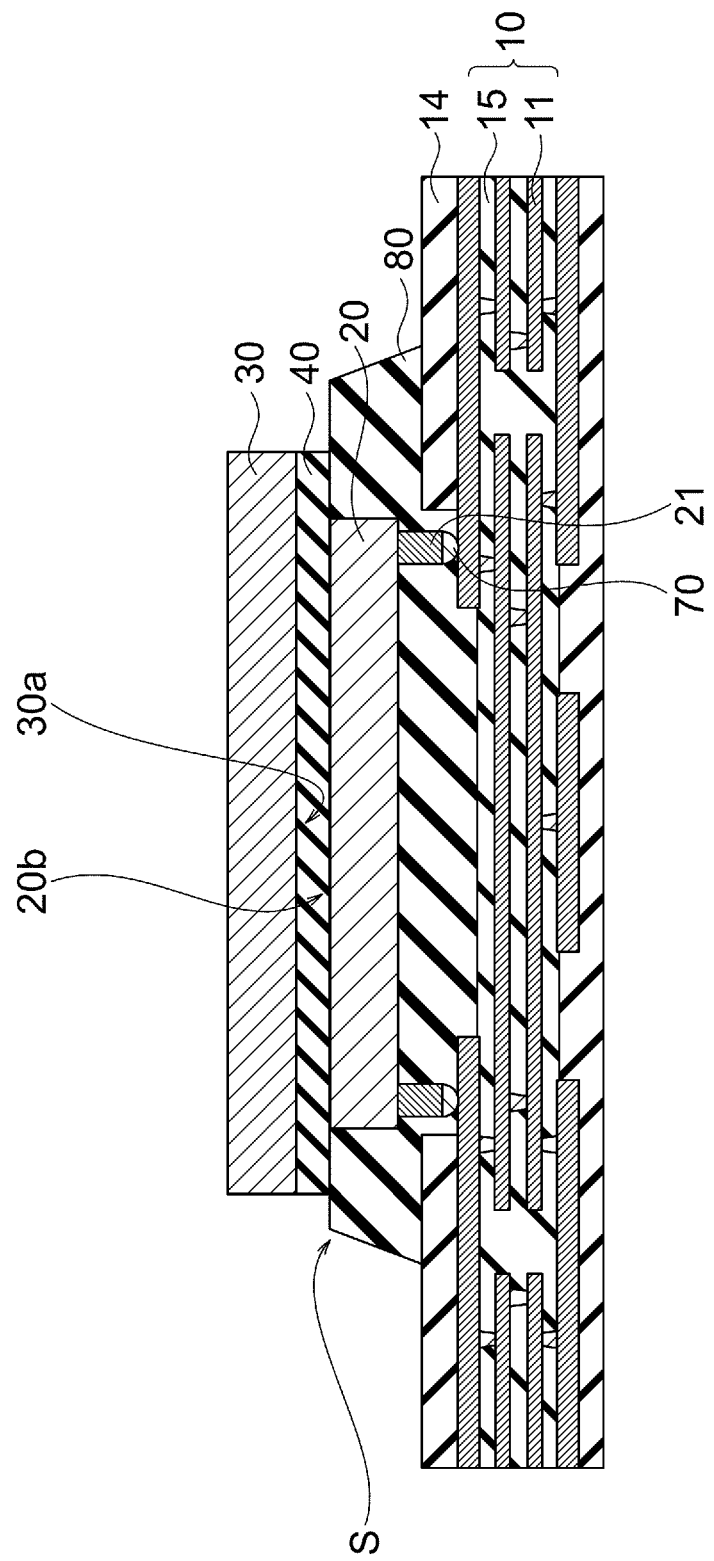

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2020-116296, filed on Jul. 6, 2020, the entire contents of which are incorporated herein by reference.

FIELD

Embodiments described herein relate generally to a semiconductor device and a manufacturing method thereof.

BACKGROUND

A package structure of a semiconductor device can include a number of memory chips are stacked above a controller chip that is flip-chip connected to a substrate. For example, a spacer chip can be provided around the controller chip and the memory chips are supported by the controller chip and the spacer chip.

However, the spacer chip may increase the assembly cost and the number of processes. Furthermore, matching heights between the controller chip and the spacer chip is challenging. If a step is generated, wettability of the memory chip in the lowermost stage deteriorates, which can deteriorate, the mold-filling property of a tunnel portion.

DESCRIPTION OF THE DRAWINGS

FIG. 12 is a diagram illustrating the example of the manufacturing method of the semiconductor device following FIG. 11.

DETAILED DESCRIPTION

Figure 1:
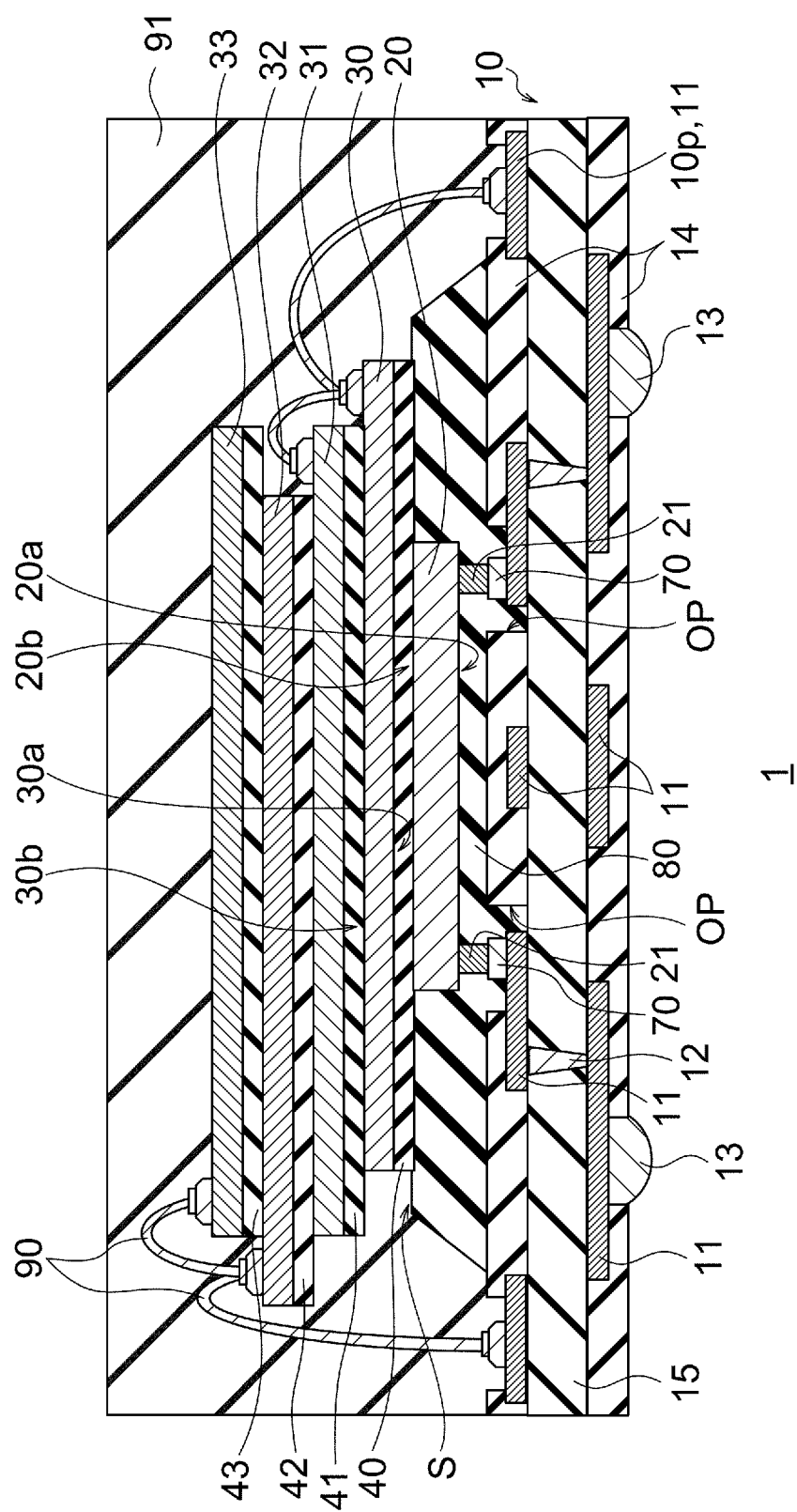
FIG. 1 is a cross-sectional view illustrating a configuration example of a semiconductor device according to a first embodiment.

Embodiments provide a semiconductor device capable of more appropriately supporting a semiconductor chip without using a spacer chip, and a manufacturing method thereof.

In general, according to one embodiment, there is provided a semiconductor device. The semiconductor device includes a wiring board; a first semiconductor chip including a first surface, a second surface opposite to the first surface, and a connection bump on the first surface, the first semiconductor chip coupled to the wiring board through the connection bump; a resin layer covering the connection bump between the first semiconductor chip and the wiring board, an upper surface of the resin layer substantially parallel to the second surface of the first semiconductor chip; and a second semiconductor chip including a third surface, a fourth surface opposite to the third surface, and an adhesive layer on the third surface, the second semiconductor chip adhering to the second surface of the first semiconductor chip and the upper surface of the resin layer through the adhesive layer. The upper surface of the resin layer projects outside a portion of at least an outer edge of the second semiconductor chip when viewed from the top.

Hereinafter, embodiments according to the present disclosure will be described with reference to the drawings. These embodiments do not limit the present disclosure. In the following embodiments, a vertical direction of a wiring board indicates a relative direction when a surface on which a semiconductor chip is mounted is facing up, and may be different from the vertical direction according to gravitational acceleration. The drawings are schematic or conceptual, and a ratio of each part is not always the same as the actual one. In the specification and the drawings, the same elements as those described above with respect to the existing drawings are designated by the same reference numerals, and detailed description thereof will be omitted as appropriate.

First Embodiment

FIG. 1 is a cross-sectional view illustrating a configuration example of a semiconductor device 1 according to the first embodiment. The semiconductor device 1 includes a wiring board 10, semiconductor chips 20, 30 to 33, adhesive layers 40 to 43, a metal material 70, a resin layer 80, a bonding wire 90, and a sealing resin 91. The semiconductor device 1 is, for example, a package of a NAND flash memory.

The wiring board 10 may be a printed circuit board or an interposer including a wiring layer 11 and an insulating layer 15. For the wiring layer 11, a low resistance metal such as copper, nickel or an alloy thereof is used. For the insulating layer 15, an insulating material such as a glass epoxy resin is used. In the figure, the wiring layer 11 is provided on a front surface and a rear surface of the insulating layer 15. However, the wiring board 10 may have a multi-layered wiring structure in which a plurality of wiring layers 11 and a plurality of insulating layers 15 are stacked. The wiring board 10 may have a through-electrode 12 penetrating the front surface and the rear surface thereof, for example, like an interposer.

On the front surface of the wiring board 10, a solder resist layer 14 provided on the wiring layer 11 is provided. The solder resist layer 14 is an insulating layer for protecting the wiring layer 11 from the metal material 70 and preventing short-circuit defects. The solder resist layer 14 is provided with an opening OP, and a part of the wiring layer 11 and the insulating layer 15 are exposed from the opening OP.

The solder resist layer 14 provided on the wiring layer 11 is also provided on the rear surface of the wiring board 10. A metal bump 13 is provided on the wiring layer 11 exposed from the solder resist layer 14. The metal bump 13 electrically connects another component (not illustrated) to the wiring board 10.

A semiconductor chip 20 is provided on the front surface side of the wiring board 10. The semiconductor chip 20 is, for example, a controller chip that controls a memory chip. A semiconductor element (not illustrated) is provided on a surface of the semiconductor chip 20 facing the wiring board 10. The semiconductor element may be, for example, a complementary metal oxide semiconductor (CMOS) circuit that configures a controller. An electrode pillar 21 electrically connected to the semiconductor element is provided on the rear surface of the semiconductor chip 20. For the electrode pillar 21, a low resistance metal material such as copper, nickel or an alloy thereof is used.

The electrode pillar 21 as a connection bump is inserted into the opening OP of the wiring board 10. The metal material 70 is provided around the electrode pillar 21. The electrode pillar 21 is electrically connected to the exposed wiring layer 11 at the opening OP through the metal material 70. As the metal material 70, for example, a low resistance metal material such as solder, silver, or copper is used. The metal material 70, for example, covers a part of the wiring layer 11 of the wiring board 10 in the opening OP, and also covers a part of side surfaces of the electrode pillar 21 of the semiconductor chip 20. With this configuration, the metal material 70 electrically connects the electrode pillar 21 of the semiconductor chip 20 and the wiring layer 11 of the wiring board 10.

More specifically, the semiconductor chip 20 includes a surface 20a, a surface 20b opposite to the surface 20a, and the electrode pillar 21 on the surface 20a. The semiconductor chip 20 is connected to the wiring board 10 through the electrode pillar 21 on the surface 20a side.

A resin layer (underfill) 80 is provided around the semiconductor chip 20 and between the semiconductor chip 20 and the wiring board 10. The resin layer 80 is formed by curing, for example, a cured non-conductive paste (NCP), and covers and protects the periphery of the semiconductor chip 20.

More specifically, the resin layer 80 covers the electrode pillar 21 between the semiconductor chip 20 and the wiring board 10. The resin layer 80 is provided around the semiconductor chip 20 so that an upper surface S thereof is substantially parallel to the surface 20b of the semiconductor chip 20. As illustrated in FIG. 1, the resin layer 80 has a substantially trapezoidal cross-sectional shape. That is, a gradient is provided at an outer peripheral end of the resin layer 80. Accordingly, an area of the lower part of the resin layer 80 is larger than an area of the upper surface S. An upper direction of the resin layer 80 is an upper direction on the paper surface of FIG. 1. The lower direction of the resin layer 80 is the lower direction in the paper surface of FIG. 1.

The semiconductor chip 30 is adhered onto the semiconductor chip 20 through the adhesive layer 40. The semiconductor chip 30 is, for example, a memory chip including a NAND flash memory. The semiconductor chip 30 includes a semiconductor element (not illustrated) on the front surface thereof. The semiconductor element may be, for example, a memory cell array and a peripheral circuit (CMOS circuit) thereof. The memory cell array may be a three-dimensional memory cell array in which a plurality of memory cells are three-dimensionally arranged. The semiconductor chip 31 is adhered onto the semiconductor chip 30 through the adhesive layer 41. The semiconductor chip 32 is adhered onto the semiconductor chip 31 through the adhesive layer 42. The semiconductor chip 33 is adhered onto the semiconductor chip 32 through the adhesive layer 43. The semiconductor chips 31 to 33 are memory chips including a NAND flash memory, similar to the semiconductor chip 30, for example. The semiconductor chips 30 to 33 may be the same memory chip. In the figure, in addition to the semiconductor chip 20 as the controller chip, the semiconductor chips 30 to 33 as the four memory chips are stacked. However, the number of stacked semiconductor chips may be 3 or less or 5 or more.

More specifically, the semiconductor chip 30 includes a surface 30a, a surface 30b opposite the surface 30a, and the adhesive layer 40 on the surface 30a. The semiconductor chip 30 is adhered to the surface 20b of the semiconductor chip 20 and the upper surface S of the resin layer 80 through the adhesive layer 40 on the surface 30a side.

The resin layer 80 supports the semiconductor chip 30. Accordingly, a spacer is not provided between the semiconductor chip 30 and the wiring board 10. The resin layer 80 is provided not only around the semiconductor chip 20 but also in a wide area. In the example illustrated in FIG. 1, the outer peripheral end of the resin layer 80 is located between the outside of the semiconductor chip 30 and the wiring layer 11 (pad 10p). With this configuration, when the bonding wire 90 is connected to a pad (see pad 30p illustrated in FIG. 2) of the semiconductor chip 30, the semiconductor chip 30 can be appropriately supported. Accordingly, since the resin layer 80 supports the semiconductor chip 30, a spacer for supporting the semiconductor chip 30 becomes unnecessary. In the example illustrated in FIG. 1, the lower part of the semiconductor chip 30 is entirely filled with the resin layer 80. However, a part of semiconductor chip 30 filled with the resin layer 80 is not limited thereto, and a width of the resin layer 80 may be narrow as long as the width of the resin layer 80 is within a range in which the semiconductor chip 30 can be supported. In this case, the sealing resin 91 is filled between the semiconductor chip 30 and the wiring board 10 in addition to the resin layer 80.

The bonding wire 90 is connected to the wiring board 10 and any pad of the semiconductor chips 30 to 33. In order to connect with the bonding wire 90, the semiconductor chips 30 to 33 are stacked so as to be shifted by an amount of pad. Since the semiconductor chip 20 is flip-chip connected by the electrode pillar 21, the semiconductor chip 20 is not wire-bonded. However, the semiconductor chip 20 may also be wire-bonded in addition to connection by the electrode pillar 21.

Furthermore, the sealing resin 91 seals the semiconductor chips 20, 30 to 33, a spacer chip 50, the resin layer 80, the bonding wire 90, and the like. With this configuration, the semiconductor device 1 includes a plurality of semiconductor chips 20, 30 to 33 as one semiconductor package on the wiring board 10.

Figure 2:
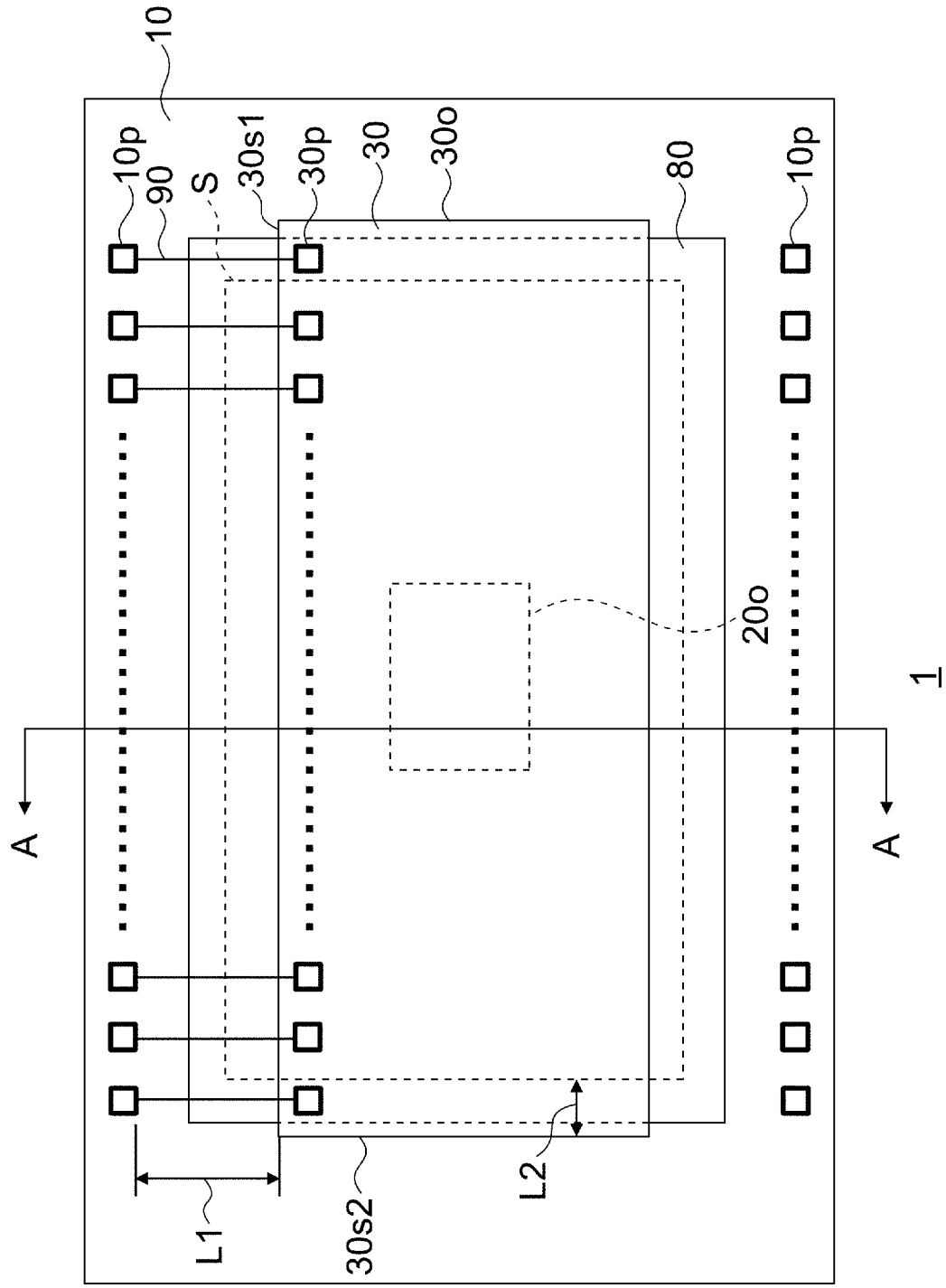
FIG. 2 is a plan view illustrating an example of a positional relationship between a wiring board, a semiconductor chip, and a resin layer of FIG. 1.

FIG. 2 is a plan view illustrating an example positional relationship between the wiring board 10, the semiconductor chips 20 and 30, and the resin layer 80 of FIG. 1. FIG. 2 is a diagram seen from above the second surface of the semiconductor chip 30. The cross-sectional view seen from line A-A in FIG. 2 corresponds to FIG. 1.

20o indicates an outer edge of the semiconductor chip 20. 30o indicates an outer edge of the semiconductor chip 30. 10p indicates a pad provided on the wiring board 10. 30p indicates a pad provided on the surface 30b of the semiconductor chip 30. 30s1 indicates a side on which the pad 30p is provided among sides of the semiconductor chip 30. The side 30s1 is the long side of the semiconductor chip 30 in the example illustrated in FIG. 2. 30s2 indicates a side of the semiconductor chip 30 on which the pad 30p is not provided among the sides of the semiconductor chip 30. The side 30s1 is the short side of the semiconductor chip 30 in the example illustrated in FIG. 2.

L1 indicates a distance between the side 30s1 and the pad 10p. L2 indicates the distance between the side 30s2 and the outer edge of the upper surface S.

The upper surface S of the resin layer 80 is wider than the outer edge 20o of the semiconductor chip 20. With this configuration, the resin layer 80 can appropriately surround and protect the semiconductor chip 20.

The upper surface S of the resin layer 80 projects outside at least a part of the outer edge 30o of the semiconductor chip 30 when viewed from above the surface 30b of the semiconductor chip 30. That is, the resin layer 80 is provided not only around the semiconductor chip 20 but also in a wide area. Furthermore, a part of the resin layer 80 is provided exceeding the outer edge 30o.

The upper surface S of the resin layer 80 projects outside the outer edge 30o on the pad 30p side provided on the surface 30b of the semiconductor chip 30 when viewed from above the surface 30b of the semiconductor chip 30. In the example illustrated in FIG. 2, the pad 30p is arranged along the side 30s1 of the semiconductor chip 30. That is, the upper surface S of the resin layer 80 projects outside the side 30s1.

The upper surface S of the resin layer 80 may be inside the outer edge 30o other than the outer edge 30o on the pad 30p side. In the example illustrated in FIG. 2, the lower part and the upper surface S of the resin layer 80 are inside the side 30s2 without projecting beyond the side 30s2. That is, depending on the direction, the resin layer 80 may be housed inside the outer edge 30o. This is because the package size and the width of the resin layer 80 are restricted depending on the product or the like due to the package size standard.

The resin layer 80 can connect the bonding wire 90 to the pad 30p provided on the surface 30b of the semiconductor chip 30 supported by the upper surface S of the resin layer 80, and is provided in a range up to the front of the pad 10p provided on the wiring board 10 and connected to the bonding wire 90. In the example illustrated in FIG. 2, the lower part of the resin layer 80 projecting to the outside of the outer edge 30o (side 30s1) is located so as not to exceed L1. Accordingly, the resin layer 80 is not in contact with the pad 10p. This is because if the resin layer 80 is in contact with the pad 10p, it becomes difficult to connect the bonding wire 90 to the pad 10p. In the example illustrated in FIG. 2, even if the upper surface S of the resin layer 80 is inside the side 30s2, since L2 is short, most of the semiconductor chip S1 is supported by the upper surface S. Accordingly, the resin layer 80 can support the semiconductor chip 30 during wire bonding. If L2 becomes long, there is a possibility that the semiconductor chip 30 is deformed during wire bonding and the bonding wire 90 cannot be connected. For example, when the pad 30p is about 50 μm angle, L2 is preferably about 200 μm or less. Accordingly, by the positional relationship described above, the resin layer 80 can support the semiconductor chip 30 during the wire bonding and is disposed so as not to be in contact with the pad 10p. An upper limit distance of L2 may change depending on, for example, the arrangement of the pad 30p. For example, when the pad 30p is provided only near the central portion of the side 30s1, the upper limit distance of L2 becomes long. Accordingly, the resin layer 80 in this case can support the semiconductor chip 30 even if L2 is long.

In the example illustrated in FIG. 2, the pad 10p for connecting to the semiconductor chips 32 and 33 is provided below the paper surface of FIG. 2. The upper surface S of the resin layer 80 projects outside the outer edge 30o even below the paper surface of FIG. 2.

Next, a manufacturing method of the semiconductor device 1 according to this embodiment will be described.

FIGS. 3 to 12 are diagrams illustrating an example of the manufacturing method of the semiconductor device 1 according to the first embodiment.

Figure 3:
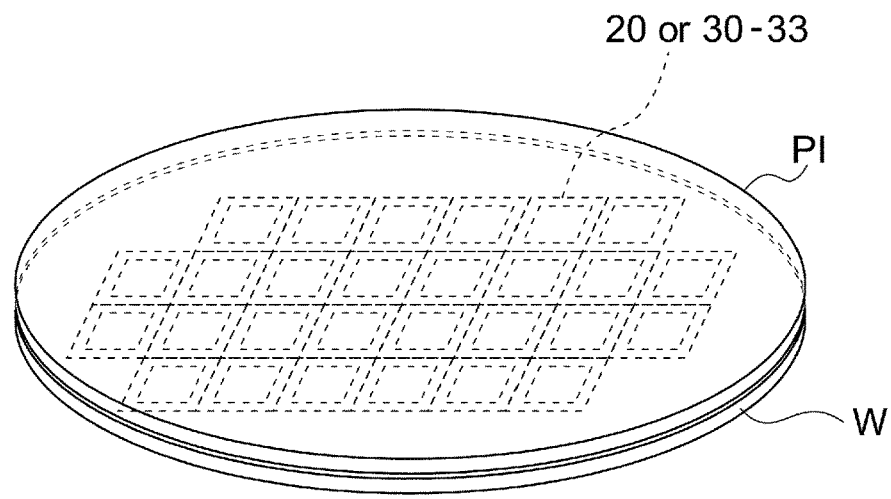
FIG. 3 is a diagram illustrating an example of a manufacturing method of the semiconductor device according to the first embodiment.

First, a semiconductor element is formed on a semiconductor wafer W. FIG. 3 is a perspective view of the semiconductor wafer W on which the semiconductor element is formed. The semiconductor element is formed on the semiconductor wafer W, and a polyimide PI covers the semiconductor element. The semiconductor wafer W includes a plurality of semiconductor chips 20 (or 30 to 33) that are singulated in a dicing process described later.

Figure 4:
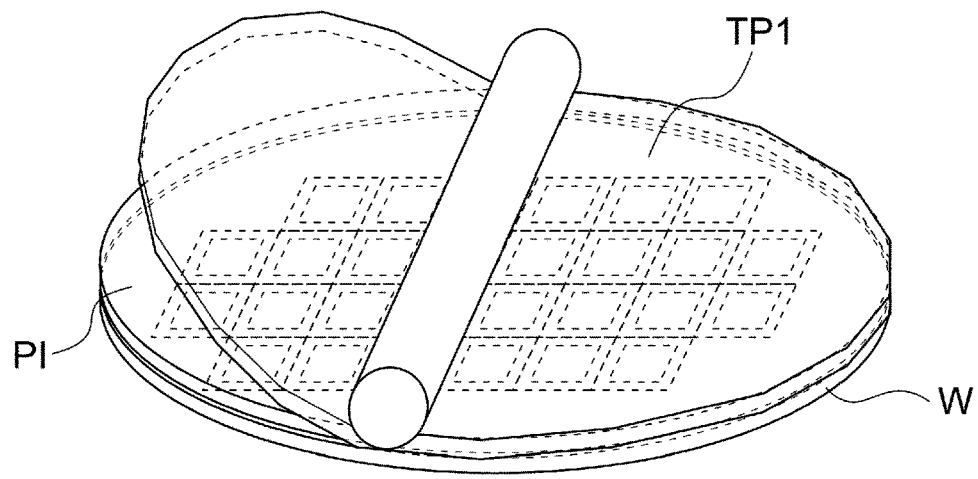
FIG. 4 is a diagram illustrating the example of the manufacturing method of the semiconductor device following FIG. 3.
Figure 5:
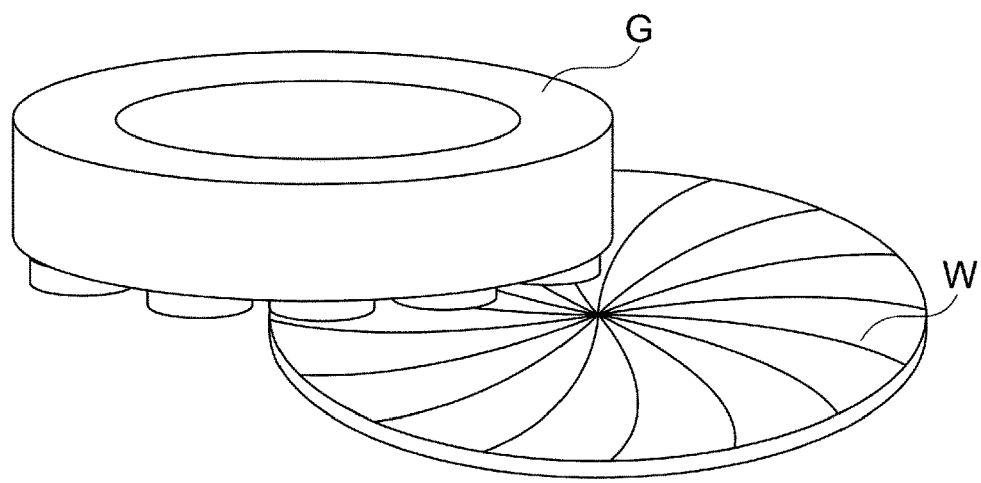
FIG. 5 is a diagram illustrating the example of the manufacturing method of the semiconductor device following FIG. 4

Next, as illustrated in FIG. 4, a protective tape TP1 is attached onto the polyimide PI. Next, as illustrated in FIG. 5, the rear surface of the semiconductor wafer W is polished with a grinder G with the protective tape TP1 facing down.

Figure 6:
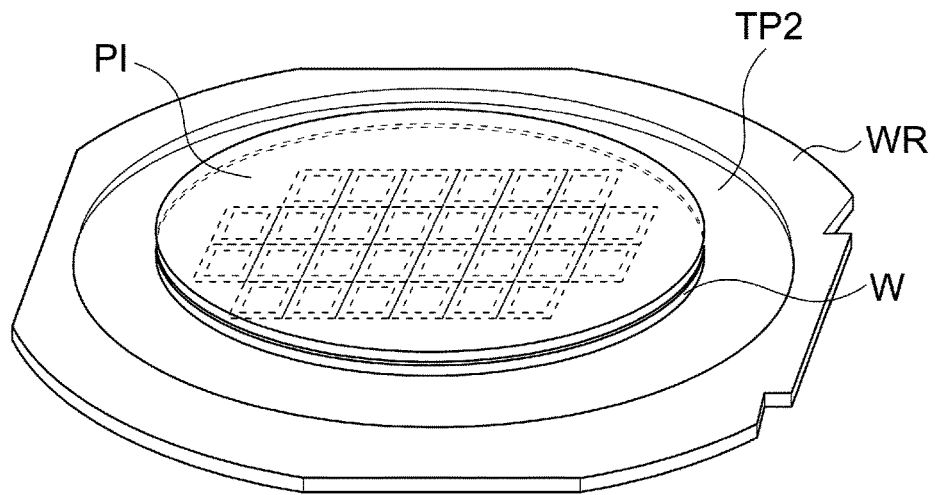
FIG. 6 is a diagram illustrating the example of the manufacturing method of the semiconductor device following FIG. 5.
Figure 7:
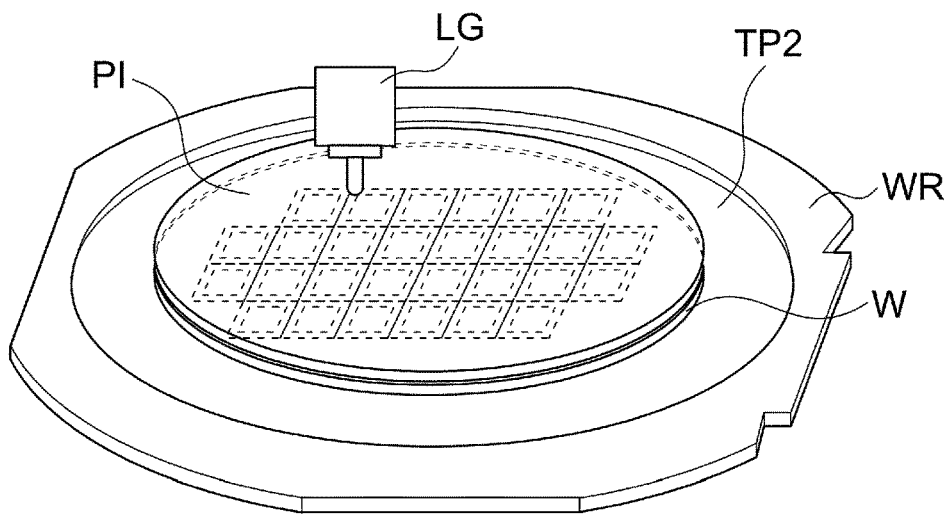
FIG. 7 is a diagram illustrating the example of the manufacturing method of the semiconductor device following FIG. 6.

After the protective tape TP1 is peeled off, the rear surface of the semiconductor wafer W is attached to a flexible resin tape TP2 stretched in a wafer ring WR as illustrated in FIG. 6. Next, as illustrated in FIG. 7, a laser oscillator LG is used to emit a laser beam along a dicing line on the front surface or the rear surface of the semiconductor wafer W. With this configuration, a groove is formed in the dicing line.

Figure 8:
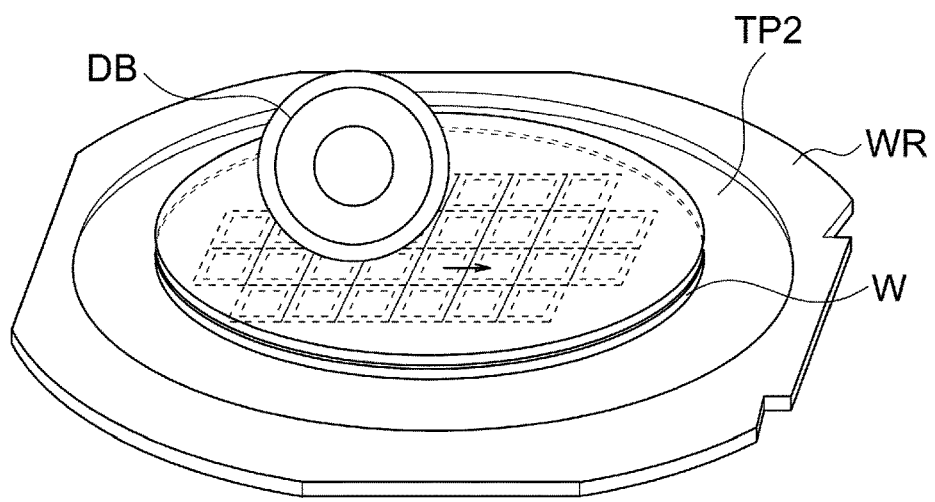
FIG. 8 is a diagram illustrating the example of the manufacturing method of the semiconductor device following FIG. 7.

Next, as illustrated in FIG. 8, the semiconductor wafer W is cut along the groove of the dicing line by a dicing blade DB. With this configuration, the semiconductor wafer W is singulated into the semiconductor chips 20 (or 30 to 33). The singulated semiconductor chips 20 (or 30 to 33) are picked up from the resin tape TP2 for mounting on the wiring board 10.

On the other hand, in the wiring board 10, the insulating layer 15, the wiring layer 11, the through-electrode 12, and the solder resist layer 14 are formed. Next, the opening OP is formed in the solder resist layer 14 by using a mask material formed on the solder resist layer 14. In this case, the opening OP is formed so as to expose the wiring layer 11 and the insulating layer 15 around the wiring layer 11.

Figure 9:
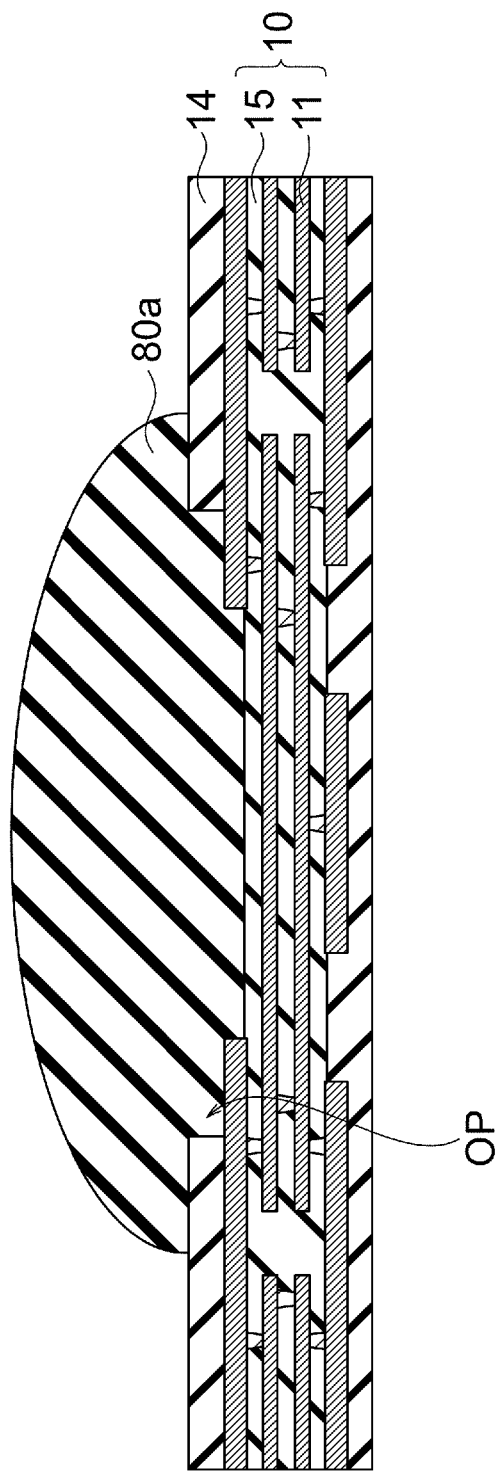
FIG. 9 is a diagram illustrating the example of the manufacturing method of the semiconductor device following FIG. 8.

Next, as illustrated in FIG. 9, a material 80a of the resin layer 80 is applied onto the wiring board 10. As described with reference to FIG. 2, a sufficient amount of material 80a is applied so that the resin layer 80 can support the semiconductor chip 20.

Figure 10:
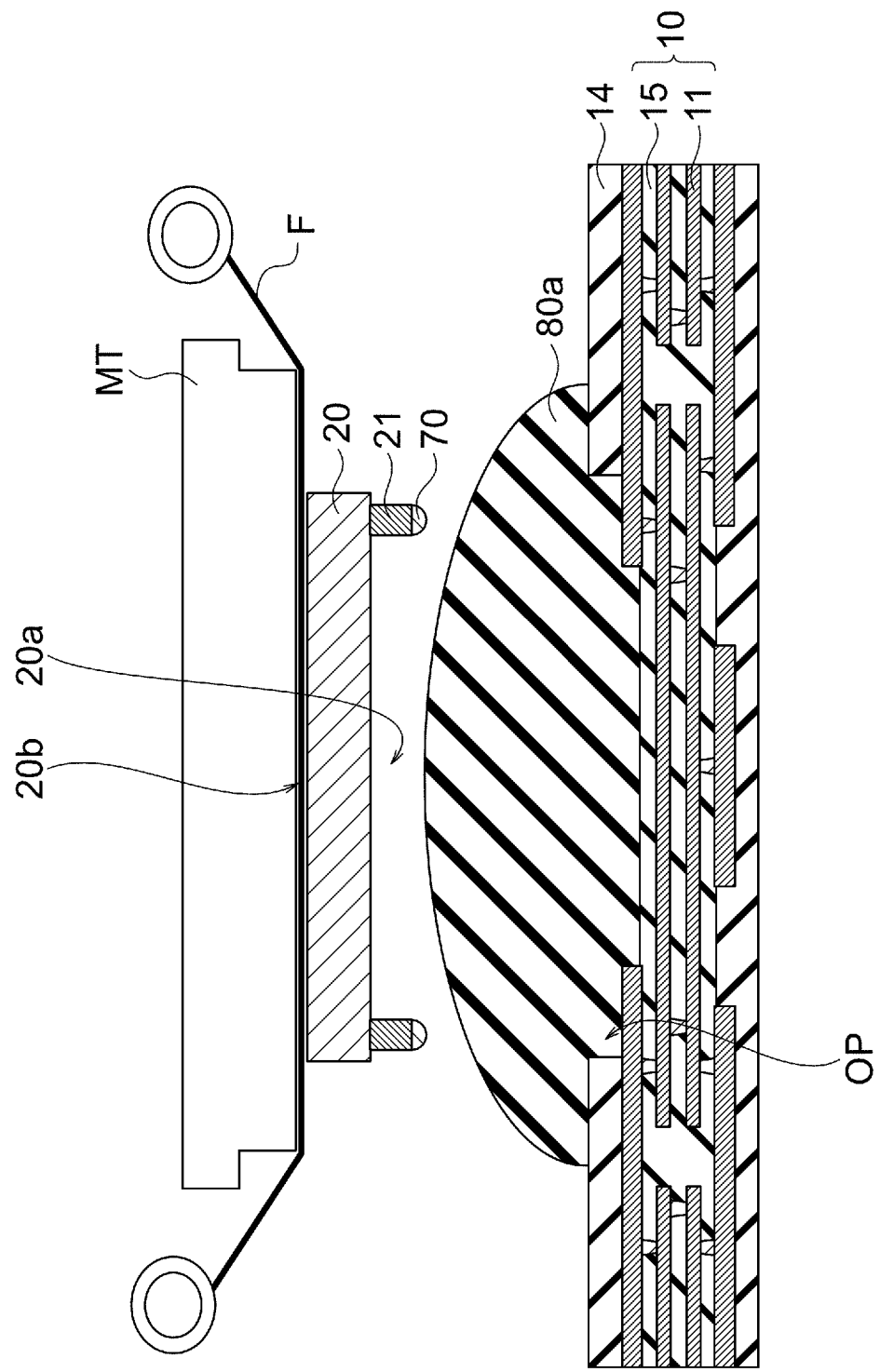
FIG. 10 is a diagram illustrating the example of the manufacturing method of the semiconductor device following FIG. 9.

Next, as illustrated in FIG. 10, the semiconductor chip 20 formed in the process illustrated in FIG. 8 is picked up, and the surface 20a of the semiconductor chip 20 is made to face the wiring board 10 by a mount tool MT. The mount tool MT includes suction holes (not illustrated) and sucks the semiconductor chip 20 through a film F in which the suction holes are similarly formed. The film F prevents the material 80a from crawling up and being in contact with the mount tool MT during pressing of the material 80a by the mount tool MT. This is because if the material 80a enters the suction hole of the mount tool MT, the mount tool MT cannot be used as the mount tool MT. That is, the film F protects the mount tool MT. The size of the surface of the mount tool MT facing the surface 20b is preferably sufficiently larger than the size of the semiconductor chip 20.

Figure 11:
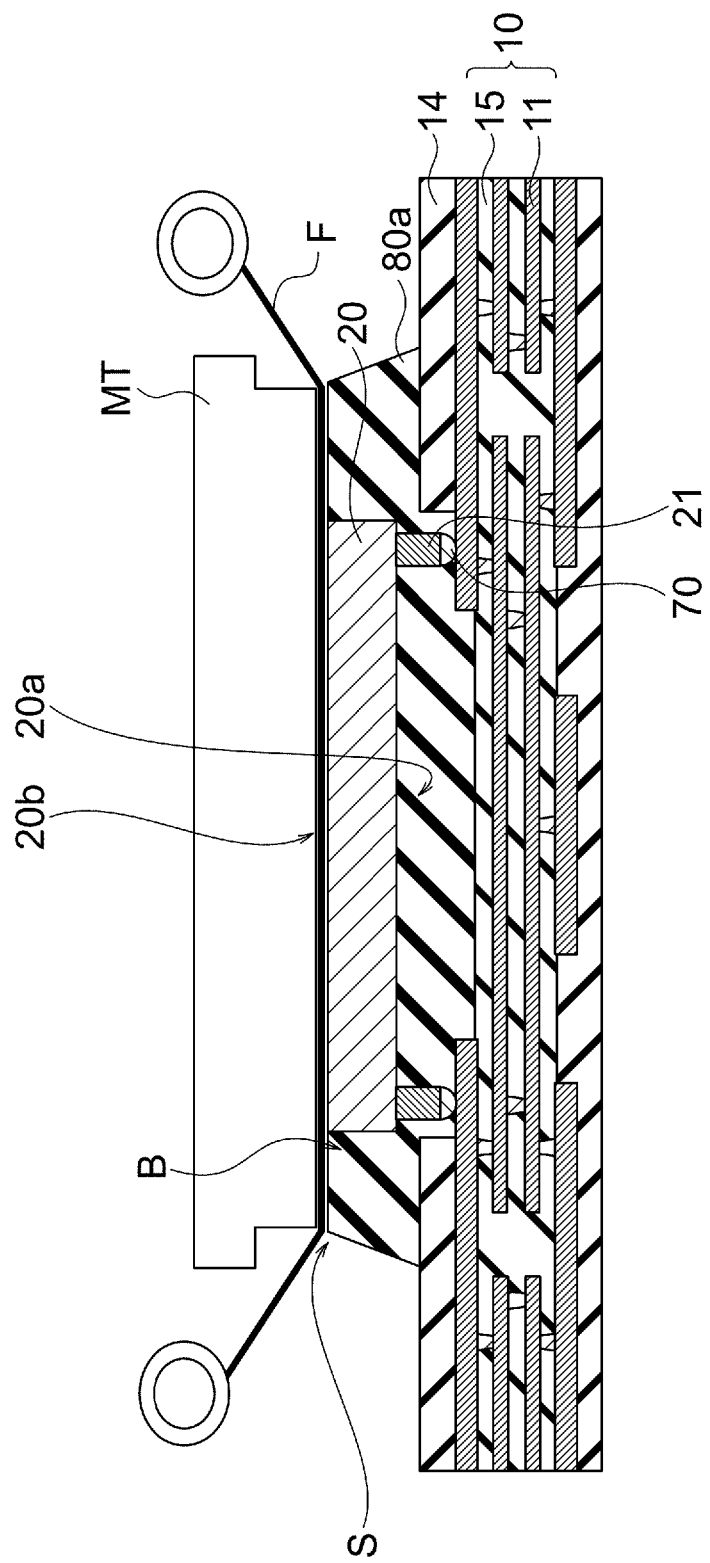
FIG. 11 is a diagram illustrating the example of the manufacturing method of the semiconductor device following FIG. 10.

Next, as illustrated in FIG. 11, the semiconductor chip 20 and the material 80a are pressed by the mount tool MT. By pressing, the material 80a spreads in the lateral direction in the paper surface of FIG. 11. Accordingly, the material 80a can be filled up to the end of the mount tool MT. Since the surface of the mount tool MT facing the surface 20b is substantially flat, the upper surface S is also substantially flat. For example, flip-chip connection is performed by thermocompression bonding. With this configuration, the semiconductor chip 20 is connected to the wiring board 10.

Next, although not illustrated, curing processing and plasma processing of the resin layer 80 are performed. By plasma processing, an adhesion property between the surface 20b of the semiconductor chip 20 and the adhesive layer 40 is improved. The resin layer 80 shrinks due to curing. Accordingly, the upper surface S and the surface 20b may not always be exactly parallel to each other. However, the difference between the upper surface S and the surface 20b is sufficiently small, and the adverse effect on the semiconductor chip 20 is prevented by the adhesive layer 40.

That is, the electrode pillar 21 is connected to the wiring board 10 in the resin layer 80 by making the surface 20a of the semiconductor chip 20 face the wiring board 10 and the resin layer 80 is cured so that the upper surface S of the resin layer 80 is substantially parallel to the surface 20b of the semiconductor chip 20. The upper surface S of the resin layer 80 is substantially parallel to the surface 20b of the semiconductor chip 20 at a boundary portion B between the outer peripheral end of the semiconductor chip 20 and the resin layer 80. This is because the material 80a is pressed by the mount tool MT having a substantially flat lower surface and is filled so as to be in contact with the film F at the outer peripheral end of the semiconductor chip 20.

Next, as illustrated in FIG. 12, the semiconductor chip 30 formed in the process illustrated in FIG. 8 is picked up, and the semiconductor chip 30 is adhered to the semiconductor chip 20 and the resin layer 80. That is, the surface 30a of the semiconductor chip 30 is adhered to the surface 20b of the semiconductor chip 20 and the upper surface S of the resin layer 80 through the adhesive layer 40.

After that, adhesion of the semiconductor chips 31 to 33, connection of the bonding wire 90, and sealing of the semiconductor chips 20, 30 to 33 with the sealing resin 91 are performed.

As described above, according to the first embodiment, the resin layer 80 is provided around the semiconductor chip 20 so that the upper surface S is substantially parallel to the surface 20b of the semiconductor chip 20. The upper surface S of the resin layer 80 projects outside at least a part of the outer edge 30o of the semiconductor chip 30 when viewed from above the surface 30b of the semiconductor chip 30. For example, the resin layer 80 having the upper surface S having an area comparable to that of the semiconductor chip 20 is provided. With this configuration, the resin layer 80 appropriately supports the semiconductor chip 20. Accordingly, the semiconductor chip 30 can be supported more appropriately without using the spacer chip. Since the spacer tip is not used, for example, an increase in the number of processes can be prevented.

A structure in which the memory chip covers the controller chip with a thick die attach film (DAF) without using a spacer chip is known. However, in this structure, the memory chip may be distorted in a dome shape when the controller chip is buried in the DAF. The center of the memory chip needs to be matched with the center of the controller chip. If the memory chip is shifted with respect to the controller chip, burying of the controller chip may be difficult and support of the memory chip may become difficult. As a result, the memory chip may be easily inclined. Accordingly, the memory chip may not be appropriately supported.

In contrast, in the first embodiment, the semiconductor chip 20 does not need to be buried, and the semiconductor chip 30 only needs to be adhered to the semiconductor chip 20 and the resin layer 80. Accordingly, the degree of difficulty mounting the semiconductor chip 30 is low. The semiconductor chip 30 does not necessarily need to be arranged directly above the semiconductor chip 20. Accordingly, the degree of freedom in a mounting position of the semiconductor chip 30 can be improved. Moreover, since the DAF (adhesive layer 40) can be made thin, the material cost can be reduced.

Second Embodiment

Figure 13A:
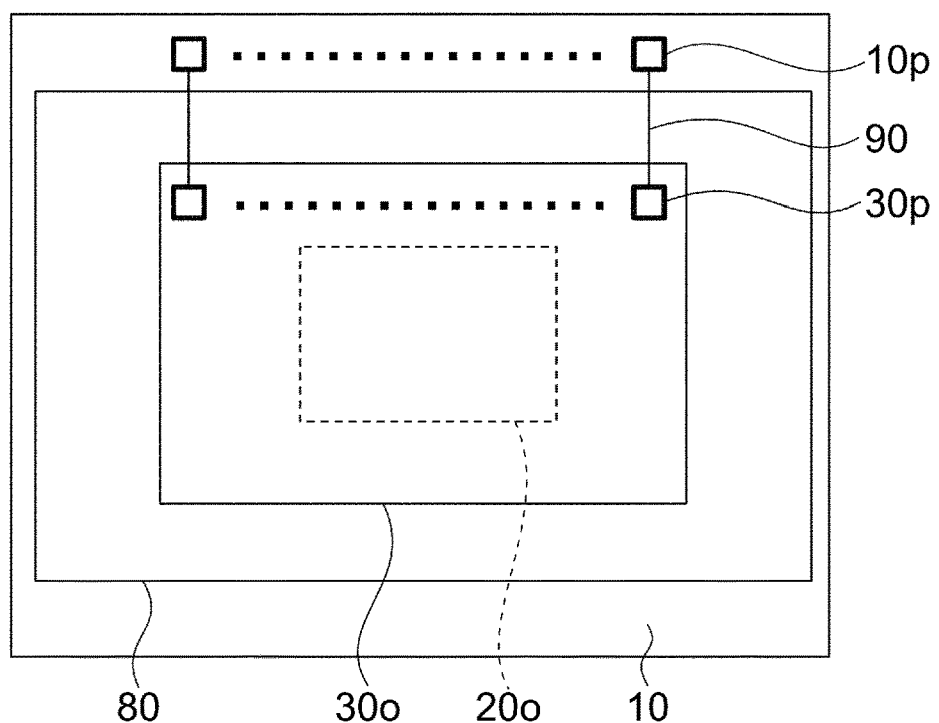
FIG. 13A is a plan view illustrating an example of a positional relationship between the semiconductor chip and the resin layer.
Figure 13B:
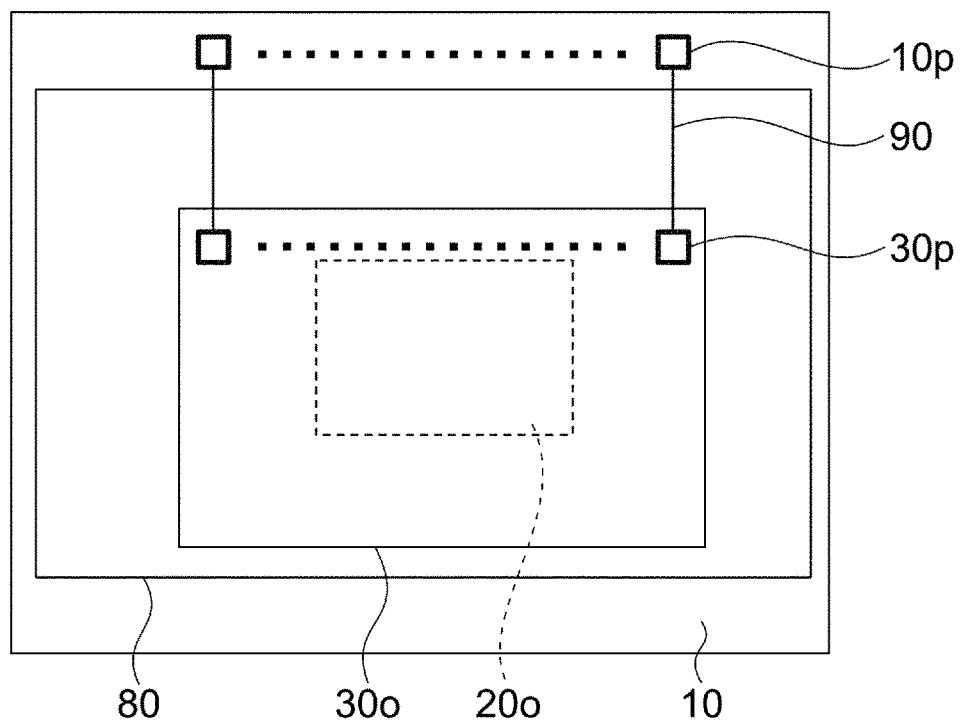
FIG. 13B is a plan view illustrating another example of the positional relationship between the semiconductor chip and the resin layer.

FIGS. 13A and 13B are diagrams illustrating the semiconductor device 1 according to the second embodiment. The second embodiment is different from the first embodiment in that an offset (shift) exists at the position of the semiconductor chip 30. FIGS. 13A and 13B are plan views illustrating an example of the positional relationship between the semiconductor chip 30 and the resin layer 80, respectively. The upper surface S is omitted. The resin layer 80 illustrated in FIGS. 13A and 13B projects outside the entire outer edge 30o of the semiconductor chip 30.

In the example illustrated in FIG. 13A, the center position of the semiconductor chip 30 substantially coincides with the center position of the semiconductor chip 20 and the center position of the resin layer 80. On the other hand, the semiconductor chip 30 illustrated in FIG. 13B is shifted in the lower direction in the paper surface from the semiconductor chip 30 illustrated in FIG. 13A. Accordingly, the center position of the semiconductor chip 30 is shifted from the center position of the semiconductor chip 20 and the center position of the resin layer 80. That is, the semiconductor chip 30 is shifted with respect to the semiconductor chip 20 or the resin layer 80 when viewed from above the surface 30b of the semiconductor chip 30. More specifically, the semiconductor chip 30 is shifted with respect to the semiconductor chip 20 or the resin layer 80 so that the pad 30p provided on the semiconductor chip 30 is separated from the pad 10p provided on the wiring board 10 and electrically connected to the pad 30p. With this configuration, for example, the distance between the pad 10p and the pad 30p can be increased. By increasing the distance between the pads 10p and 30p, the wire bonding property can be improved.

In this way, the mounting position of the semiconductor chip 30 can be changed within the range in which the resin layer 80 can support the semiconductor chip 30. Accordingly, the degree of freedom in package design can be improved.

In the structure in which the memory chip covers the controller chip with the thick DAF described above, the mounting position of the memory chip is determined by the position of the controller chip. Accordingly, the positional relationship between the pads 10p and 30p is also difficult to change.

In contrast, in the second embodiment, the arrangement of the semiconductor chips 30 can be shifted to change the distance between the pads 10p and 30p. In the package design, the degree of freedom in designing the position of the pad 10p can be improved.

Since other configurations of the semiconductor device 1 according to the second embodiment are the same as the corresponding configurations of the semiconductor device 1 according to the first embodiment, detailed description thereof will be omitted. The semiconductor device 1 according to the second embodiment can obtain the same effect as that of the first embodiment.

Third Embodiment

Figure 14A:
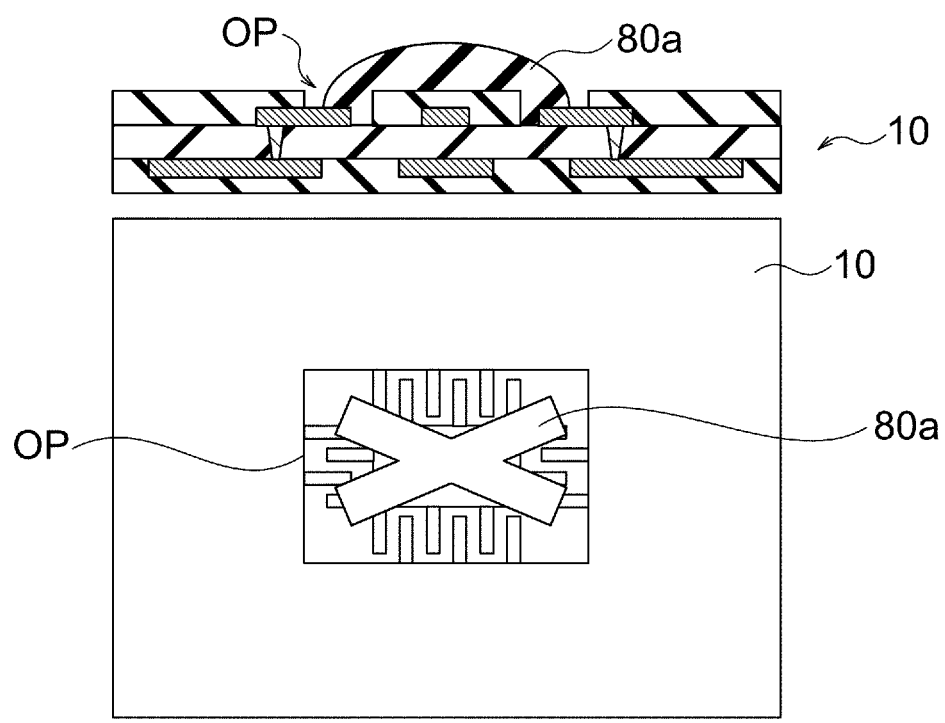
FIG. 14A is a diagram illustrating an example of a material of the resin layer when an applying amount is small.
Figure 14B:
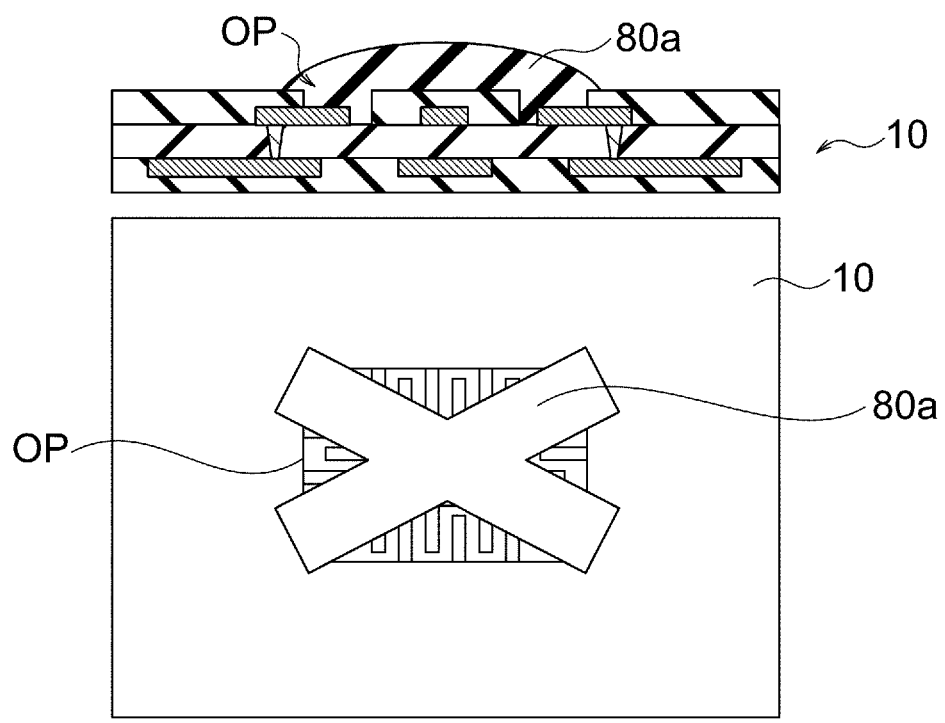
FIG. 14B is a diagram illustrating an example of the material of the resin layer when the applying amount is large.

FIGS. 14A and 14B are diagrams illustrating the semiconductor device 1 according to the third embodiment. The third embodiment is different from the first embodiment in that an adjusted amount of the material 80a of the resin layer 80 is applied onto the wiring board 10. FIG. 14A is a diagram illustrating an example of the material 80a of the resin layer 80 when the applying amount is small. In FIG. 14A, the upper stage illustrates a cross-sectional view, and the lower stage illustrates a plan view. FIG. 14B is a diagram illustrating an example of the material 80a of the resin layer 80 when the applying amount is large. In FIG. 14B, the upper stage illustrates a cross-sectional view, and the lower stage illustrates a plan view.

The plan views of FIGS. 14A and 14B illustrate the applying process of the material 80a in FIG. 9. In the examples illustrated in FIGS. 14A and 14B, the material 80a is applied in an X shape in the vicinity of the opening OP.

In the process illustrated in FIG. 9, an amount of the material of the resin layer 80 adjusted so that the upper surface S of the resin layer 80 has a predetermined area is applied onto the wiring board 10. In the example illustrated in FIG. 14A, since the applying amount of the material 80a is small, the area of the cured resin layer 80 becomes small. On the other hand, in the example illustrated in FIG. 14B, since the applying amount of the material 80a is large, the area of the cured resin layer 80 becomes large. The resin layer 80 needs to be pressed with the mount tool MT having a size in accordance with a predetermined area.

In this way, by adjusting the applying amount of the material 80a, the area (volume) of the resin layer 80 and the area of the upper surface S of the resin layer can be adjusted.

Since the other configurations of the semiconductor device 1 according to the third embodiment are the same as the corresponding configurations of the semiconductor device 1 according to the first embodiment, detailed description thereof will be omitted. The semiconductor device 1 according to the third embodiment can obtain the same effect as that of the first embodiment. The semiconductor device 1 according to the third embodiment may be combined with the second embodiment.

Fourth Embodiment

Figure 15A:
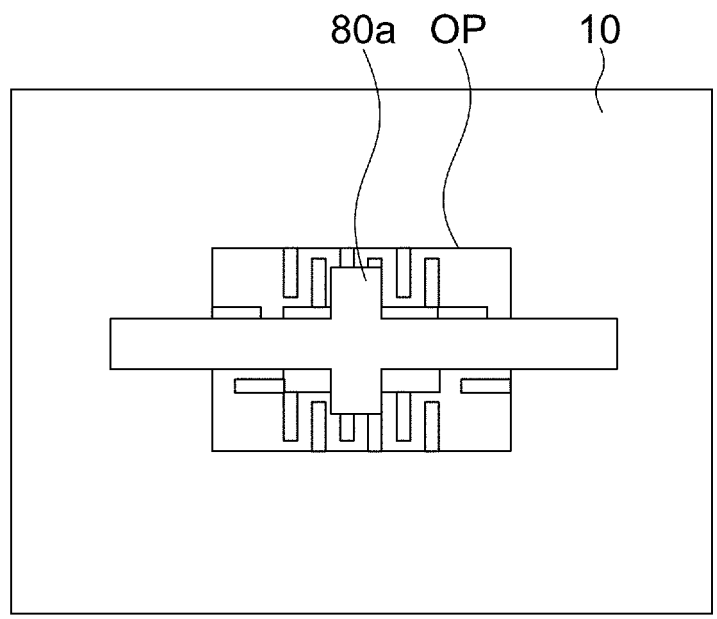
FIG. 15A is a plan view illustrating an example of an applying position of the material of the resin layer.
Figure 15B:
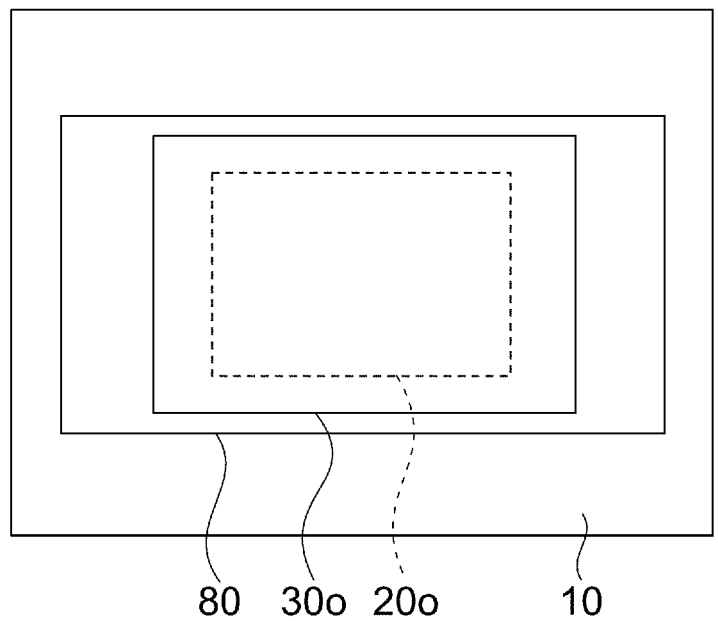
FIG. 15B is a plan view illustrating a positional relationship between the semiconductor chip and the resin layer at the applying position of FIG. 15A.

FIGS. 15A to 15D are diagrams illustrating the semiconductor device 1 according to the fourth embodiment. The fourth embodiment is different from the first embodiment in that the size and position of the resin layer 80 relative to the semiconductor chips 20 and 30 change depending on the applying position of the material 80a of the resin layer 80. FIG. 15A is a plan view illustrating an example of the applying position of the material 80a of the resin layer 80. FIG. 15B is a plan view illustrating the positional relationship between the semiconductor chip 30 and the resin layer 80 at the applying position of FIG. 15A.

In the process illustrated in FIG. 9, the material of the resin layer 80 is applied onto the wiring board 10 so as to form the resin layer 80 at a predetermined position on the wiring board 10 or to form the resin layer 80 in a predetermined shape. In the example illustrated in FIG. 15A, the material 80a of the resin layer 80 is applied in a cross shape in the vicinity of the opening OP. The material 80a is applied long in the lateral direction of the paper surface. With this configuration, as illustrated in FIG. 15B, the resin layer 80 long in the lateral direction in the paper surface is formed.

Figure 15C:
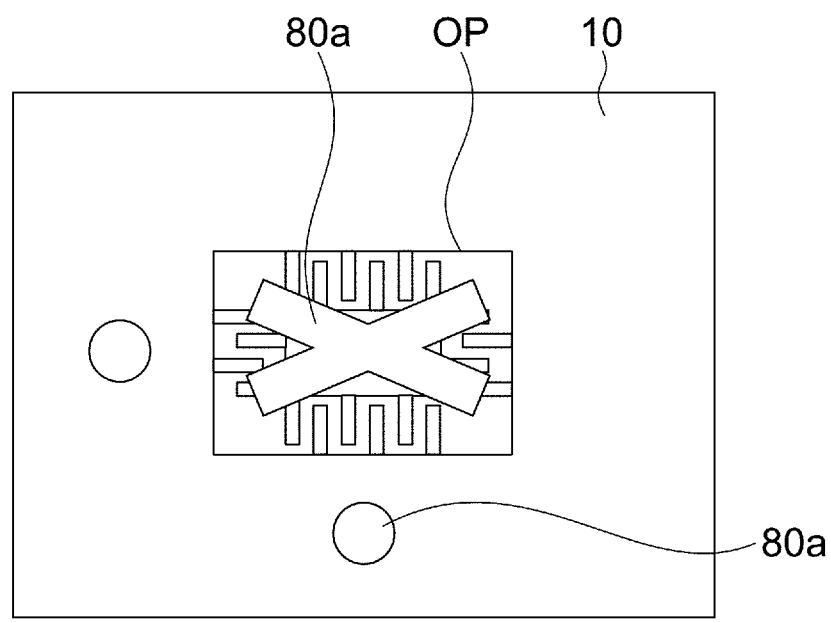
FIG. 15C is a plan view illustrating another example of the applying position of the material of the resin layer.
Figure 15D:
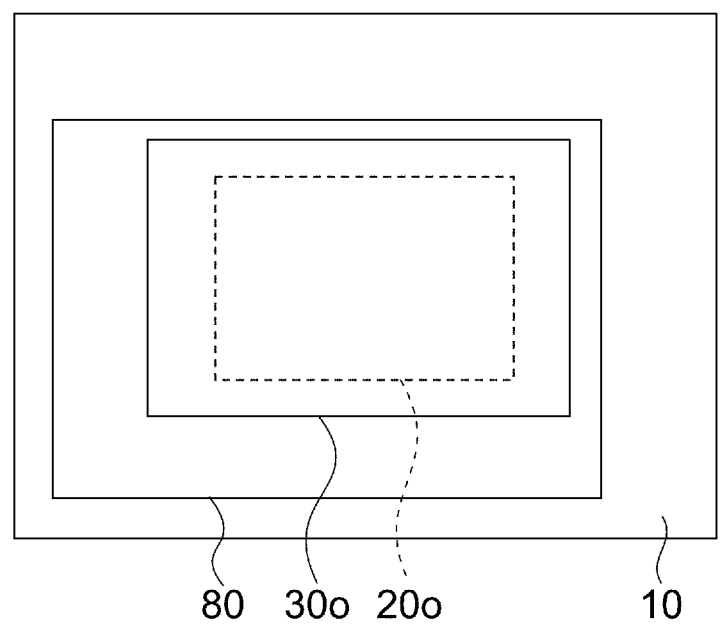
FIG. 15D is a plan view illustrating the positional relationship between the semiconductor chip and the resin layer at the applying position of FIG. 15C.

FIG. 15C is a plan view illustrating an example of the applying position of the material 80a of the resin layer 80. FIG. 15D is a plan view illustrating the positional relationship between the semiconductor chip 30 and the resin layer 80 at the applying position of FIG. 15C.

In the example illustrated in FIG. 15C, the material 80a of the resin layer 80 is applied in an X shape in the vicinity of the opening OP. The material 80a of the resin layer 80 is applied in a round shape at two points in the left direction in the paper surface and the lower direction in the paper surface away from the opening OP. With this configuration, as illustrated in FIG. 15D, a long resin layer 80 is formed in the lower left direction in the paper surface while covering the semiconductor chip 20.

In this way, the position and shape of the resin layer 80 can be adjusted by adjusting the applying position and coating shape of the material 80a.

Since the other configurations of the semiconductor device 1 according to the fourth embodiment are the same as the corresponding configurations of the semiconductor device 1 according to the first embodiment, detailed description thereof will be omitted. The semiconductor device 1 according to the fourth embodiment can obtain the same effect as that of the first embodiment. The semiconductor device 1 according to the fourth embodiment may be combined with the second embodiment and the third embodiment.

Fifth Embodiment

FIGS. 16A to 16D are diagrams illustrating the semiconductor device 1 according to the fifth embodiment. In the fifth embodiment, the positional relationship between the semiconductor chip 30 and the resin layer 80 is different from that in the first embodiment. FIGS. 16A to 16D are plan views illustrating an example of the positional relationship between the semiconductor chip 30 and the resin layer 80, respectively. Adjustment methods of the size and shape of the resin layer 80 may be the same as those of the third embodiment and the fourth embodiment, respectively.

Figure 16A:
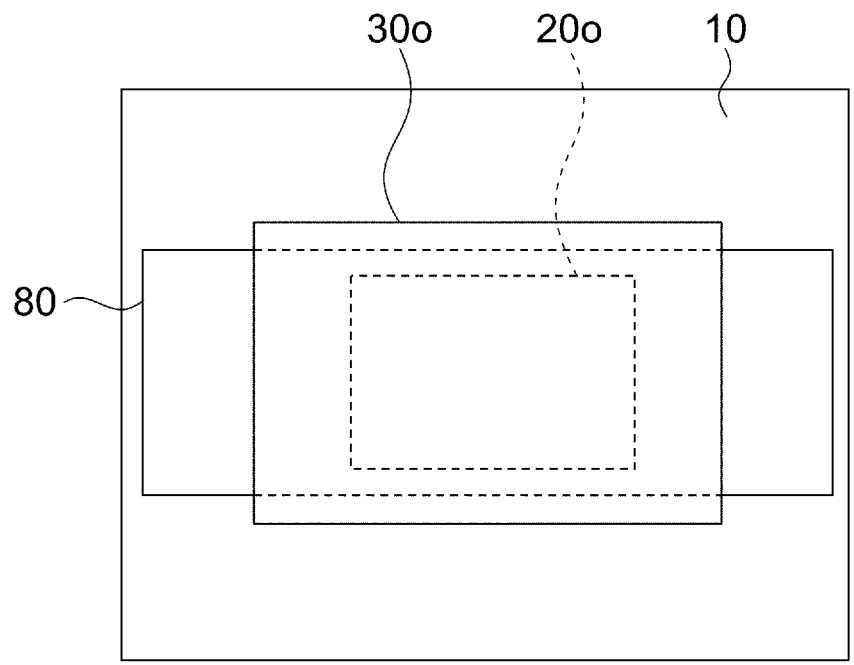
FIG. 16A is a plan view illustrating another example of the positional relationship between the semiconductor chip and the resin layer.
Figure 16B:
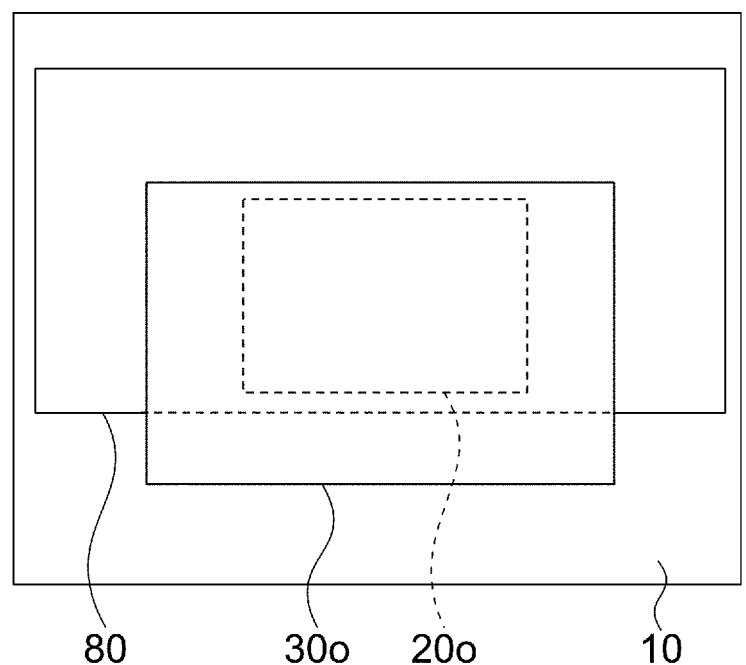
FIG. 16B is a plan view illustrating another example of the positional relationship between the semiconductor chip and the resin layer.
Figure 16C:
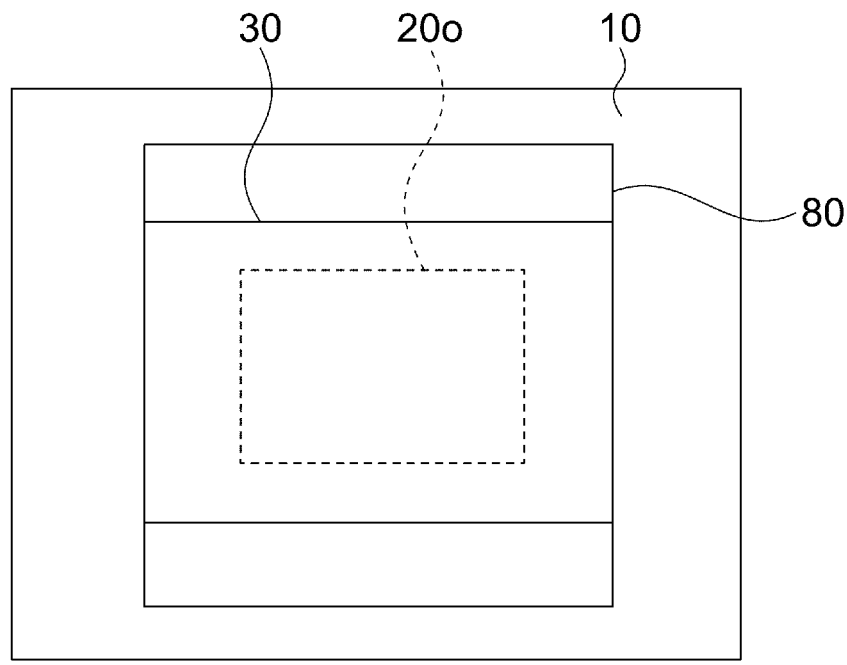
FIG. 16C is a plan view illustrating another example of the positional relationship between the semiconductor chip and the resin layer.
Figure 16D:
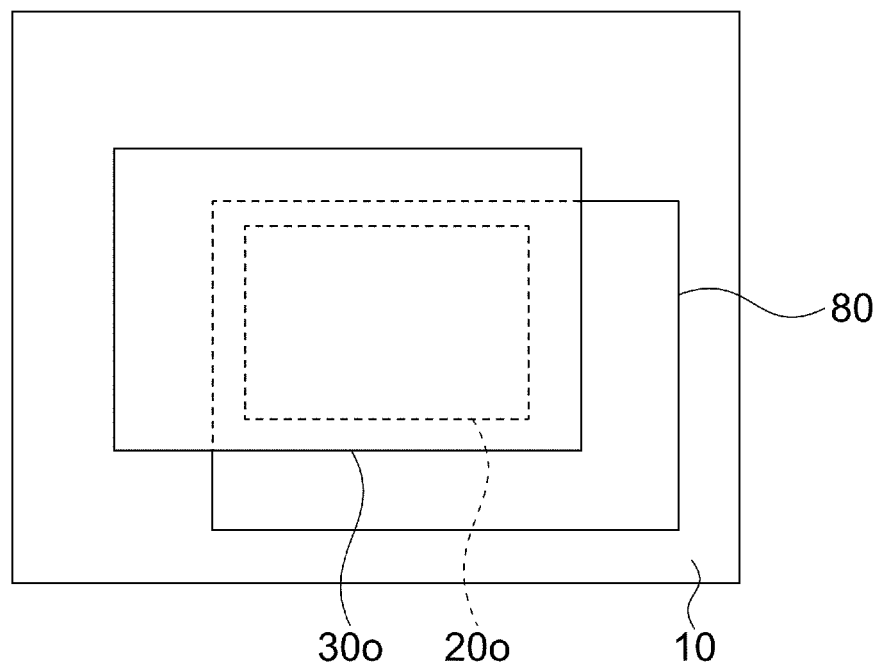
FIG. 16D is a plan view illustrating another example of the positional relationship between the semiconductor chip and the resin layer.

In the example illustrated in FIG. 16A, the resin layer 80 projects beyond the short side of the semiconductor chip 30, but does not project beyond the long side of the semiconductor chip 30. In the example illustrated in FIG. 16B, the resin layer 80 projects beyond the short side of the semiconductor chip 30 and the long side on the upper side of the paper surface, but does not project beyond the long side of the semiconductor chip 30 on the lower side of the paper surface. In the example illustrated in FIG. 16C, the resin layer 80 projects beyond the long side of the semiconductor chip 30. The outer peripheral end of the resin layer 80 substantially coincides with the short side of the semiconductor chip 30 when viewed from above the semiconductor chip 30. In the example illustrated in FIG. 16D, the resin layer 80 projects beyond the long side on the lower side of the paper surface and the short side on the right side of the paper surface of the semiconductor chip 30, but does not project beyond the long side on the upper side of the paper surface and the short side on the left side of the paper surface of the semiconductor chip 30.

More specifically, the resin layer 80 is shifted with respect to the semiconductor chip 20 or the semiconductor chip 30 when viewed from above the surface 30b of the semiconductor chip 30. In the examples illustrated in FIGS. 16B and 16D, for example, the center position of the resin layer 80 is shifted from the center position of the semiconductor chip 20 and the center position of the semiconductor chip 30.

In this way, only a specific side of the resin layer 80 may be larger or smaller than the semiconductor chip 30. That is, the position and shape of the resin layer 80 can be changed within the range in which the resin layer 80 can support the semiconductor chip 30. Accordingly, the degree of freedom in package design can be improved.

Since the other configurations of the semiconductor device 1 according to the fifth embodiment are the same as the corresponding configurations of the semiconductor device 1 according to the first embodiment, detailed description thereof will be omitted. The semiconductor device 1 according to the fifth embodiment can obtain the same effect as that of the first embodiment. The semiconductor device 1 according to the fifth embodiment may be combined with the second to fourth embodiments.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
    a wiring board;
    a first semiconductor chip including a first surface, a second surface opposite to the first surface, and a connection bump on the first surface, the first semiconductor chip coupled to the wiring board through the connection bump;
    a resin layer covering the connection bump between the first semiconductor chip and the wiring board, an upper surface of the resin layer substantially parallel to the second surface of the first semiconductor chip; and
    a second semiconductor chip including a third surface, a fourth surface opposite to the third surface, and an adhesive layer on the third surface, the second semiconductor chip adhering to the second surface of the first semiconductor chip and the upper surface of the resin layer through the adhesive layer and the second semiconductor chip is a closest one to the first semiconductor chip among a plurality of semiconductor chips disposed above the first semiconductor chip; and
    a first wire connecting the wiring board to a first pad provided on the second semiconductor chip,
    wherein the upper surface of the resin layer projects outside a portion of at least an outer edge of the second semiconductor chip when viewed from the top,
    the second surface of the first semiconductor chip and the upper surface of the resin layer are coplanar with each other,
    and the upper surface of the resin layer is lower than the second semiconductor chip,
    when seen from a vertical direction of the wiring board, the first pad overlaps the resin layer.

2. The semiconductor device according to claim 1, wherein a spacer is not provided between the second semiconductor chip and the wiring board.

3. The semiconductor device according to claim 1, wherein the upper surface of the resin layer projects outside the at least an outer edge along which the first pad is provided, the first pad disposed on the fourth surface of the second semiconductor chip.

4. The semiconductor device according to claim 1, wherein the second semiconductor chip shifts away from at least one of the first semiconductor chip or the resin layer when viewed from the top.

5. The semiconductor device according to claim 3, wherein the second semiconductor chip shifts away from at least one of the first semiconductor chip or the resin layer such that the first pad is separated from a second pad that is provided on the wiring board and electrically connected to the first pad.

6. The semiconductor device according to claim 1, wherein the resin layer shifts away from at least one of the first semiconductor chip or the second semiconductor chip when viewed from the top.

7. The semiconductor device according to claim 1, wherein the upper surface of the resin layer is substantially parallel to the second surface of the first semiconductor chip at a boundary portion between an outer peripheral end of the second semiconductor chip and the resin layer.

8. The semiconductor device according to claim 5, wherein the resin layer connects the first wire to the first pad, the first pad being supported by the upper surface of the resin layer, and is provided in a range up to a front of the second pad, the second pad provided on the wiring board and connected to the first wire.

9. The semiconductor device according to claim 1, wherein the adhesive layer physically contacts the second surface of the first semiconductor chip.

* * * * *